United States Patent
Ghandehari et al.

(10) Patent No.: US 6,642,148 B1
(45) Date of Patent: Nov. 4, 2003

(54) RELACS SHRINK METHOD APPLIED FOR SINGLE PRINT RESIST MASK FOR LDD OR BURIED BITLINE IMPLANTS USING CHEMICALLY AMPLIFIED DUV TYPE PHOTORESIST

(75) Inventors: Kouros Ghandehari, Santa Clara, CA (US); Emmanuil H. Lingunis, San Jose, CA (US); Mark S. Chang, Los Altos, CA (US); Angela Hui, Fremont, CA (US); Scott Bell, San Jose, CA (US); Jusuke Ogura, Cupertino, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 5 days.

(21) Appl. No.: 10/126,326
(22) Filed: Apr. 19, 2002
(51) Int. Cl.$^7$ .............................................. H01L 21/302
(52) U.S. Cl. ....................... 438/694; 438/704; 438/708; 438/709; 438/725; 438/741
(58) Field of Search ................................ 438/708, 704, 438/709, 725, 741, 694

(56) References Cited

U.S. PATENT DOCUMENTS

| | | | |
|---|---|---|---|
| 6,097,078 A | * | 8/2000 | Sim et al. .................... 257/548 |
| 6,168,993 B1 | * | 1/2001 | Foote et al. ................. 438/262 |
| 6,248,635 B1 | | 6/2001 | Foote et al. |
| 6,270,929 B1 | | 8/2001 | Lyons et al. |
| 6,274,289 B1 | | 8/2001 | Subramanian et al. |
| 6,275,414 B1 | | 8/2001 | Randolph et al. |
| 6,287,917 B1 | | 9/2001 | Park et al. |
| 6,383,952 B1 | * | 5/2002 | Subramanian et al. ...... 438/781 |
| 6,440,799 B1 | * | 8/2002 | Trivedi ......................... 438/268 |
| 6,548,401 B1 | * | 4/2003 | Trivedi ......................... 438/638 |

OTHER PUBLICATIONS

"0.1um Level Contact Hole Pattern Formation with KrF Lithography by Resolution Enhancement Lithography Assisted by Chemical Shrink (RELACS)", Toshiyuki Toyoshima, Takeo Ishibashi, Ayumi Minanide, Kanji Sugino, Keiichi Katayama, Takayuki Shoya, Ichiro Arimoto, Naoki Yasuda, Hiroshi Adachi and Yasuji Matsui, 1998 IEEE, IEDM 98–333, 4 pages.*

* cited by examiner

Primary Examiner—Benjamin L. Utech
Assistant Examiner—Binh X. Tran
(74) Attorney, Agent, or Firm—Eschweiler & Associates, LLC

(57) ABSTRACT

The present invention generally relates to a method of forming a graded junction within a semiconductor substrate. A first masking pattern having a first opening characterized by a first lateral dimension is formed over the semiconductor substrate. The semiconductor substrate is doped with a first dopant, using the first masking pattern as a doping mask, thereby forming a first dopant region in the semiconductor substrate underlying the first opening. The first masking pattern is swelled to decrease the first lateral dimension of the first opening to a second lateral dimension. The semiconductor substrate is then doped with a second dopant, using the swelled first masking pattern as a doping mask, thereby forming a second dopant region in the semiconductor substrate, and furthermore defining a graded junction within the semiconductor substrate.

16 Claims, 7 Drawing Sheets

RELACS SHRINK METHOD APPLIED FOR SINGLE PRINT RESIST MASK FOR LDD OR BURIED BITLINE IMPLANTS USING CHEMICALLY AMPLIFIED DUV TYPE PHOTORESIST

FIELD OF THE INVENTION

The present invention relates generally to the fabrication of a semiconductor device and more particularly to a method of forming a graded junction comprising multiple doped regions in the semiconductor device.

BACKGROUND OF THE INVENTION

During semiconductor fabrication, numerous doped regions are formed in a semiconductor substrate. These doped regions perform various functions, such as source and drain regions for metal-oxide-semiconductor (MOS) transistors, buried electrical signal lines, substrate resistors and the like. Often, it is necessary to form doped regions having varying junction depths in order to meet different electrical resistance requirements and current handling requirements of a semiconductor device. Because of the electrical field created by a buried junction, the geometric profile of the junction can be important where electric components having extremely small feature sizes are being fabricated. For example, a lightly-doped-drain (LDD) structure in a channel region of an MOS transistor is necessary to insure proper functioning of a sub-micron transistor. Additionally, in advanced electrically-erasable-programmable-read-only-memory (EEPROM) devices, pocket regions are fabricated in a semiconductor substrate having a precise junction profile within the substrate.

Product development efforts in EEPROM device technology have focused on increasing programming speed, lowering programming and reading voltages, increasing data retention time, reducing cell erasure times and reducing cell dimensions. EEPROM device designers have taken advantage of the ability of silicon nitride to store charge in localized regions and have designed memory circuits that utilize two regions of stored charge within an oxide-nitride-oxide (ONO) layer. This type of non-volatile memory device is known as a two-bit EEPROM. The two-bit EEPROM is capable of storing twice as much information as a conventional EEPROM in a memory array of approximately equal size. A left and right bit is stored in physically different areas of the silicon nitride layer, near left and right regions of each memory cell. Programming methods are then used that enable two bits to be programmed and read concurrently. The two bits of the memory cell can be erased individually by applying suitable erase voltages to the gate and to either the source or drain regions. The two-bit memory cell utilizes pocket regions adjacent to a buried bit-line region. Electrons are sourced from the pocket regions and injected into the silicon nitride layer.

As advanced MOS and EEPROM devices are scaled to smaller dimensions, it becomes more difficult to form the doped regions at precise locations in the substrate. In particular, the pocket regions of EEPROM arrays using two-bit data storage and the LDD regions of MOS transistors must be carefully fabricated to avoid excessive overlap with the source and drain regions. Accordingly, as device dimensions are scaled to smaller values, advances in fabrication technology are necessary to insure proper functioning devices. Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its primary purpose is to present some concepts of the invention in a simplified form as a prelude to the more detailed description that is presented later.

The present invention relates generally to a method of forming a graded junction in a semiconductor substrate. In particular, the method can be utilized in a formation of pocket regions in an EEPROM device by performing a step of doping the semiconductor substrate at an angle of incidence substantially normal to a surface of the semiconductor substrate.

According to one aspect of the present invention, a method of forming a graded junction is disclosed, wherein a first masking pattern is formed over a surface of a semiconductor substrate, wherein the first masking has a first opening associated therewith. The first opening is associated with a first region of the semiconductor substrate, and is characterized by a first lateral dimension. The semiconductor substrate is doped with a first dopant, wherein the first masking pattern is generally used as a doping mask, thereby doping the first region of the semiconductor substrate with a first conductivity associated with the first dopant.

According to another aspect of the present invention, the first masking pattern is swelled to decrease the first lateral dimension of the first opening. The swelled first masking pattern therefore defines a second lateral dimension of the first opening, wherein the second lateral dimension is smaller than the first lateral dimension. Furthermore, the swelled first masking pattern generally overlies one or more portions of the first dopant region. According to one exemplary aspect of the invention, a RELACS process is performed to swell the first masking pattern.

In accordance with yet another aspect of the present invention, the semiconductor substrate is doped with a second dopant, wherein the swelled first masking pattern is used as a doping mask. Doping the semiconductor substrate with the second dopant defines a second dopant region. Portions of the first dopant region, however, generally retain the characteristics and conductivity of the first dopant, thereby defining pocket regions in the semiconductor substrate adjacent to the second dopant region, and furthermore defining a graded junction within the semiconductor substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
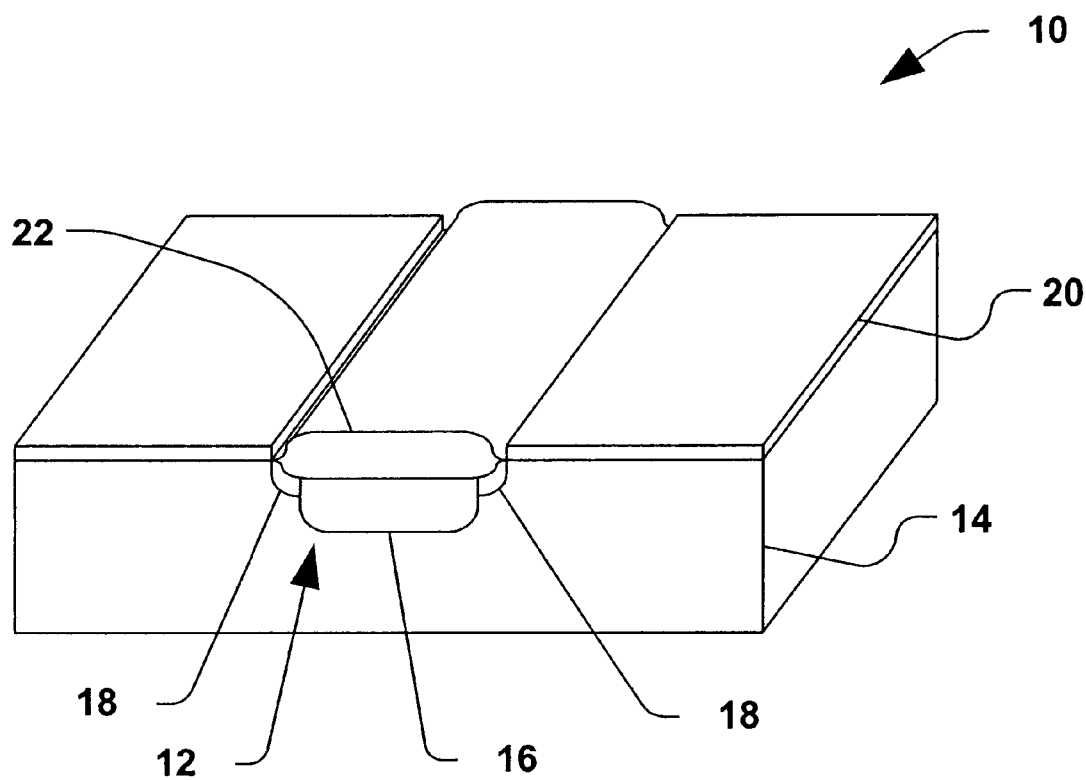
FIG. 1 illustrates a perspective view of a portion of a conventional semiconductor device comprising a graded junction.

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. In other instances, well-known structures and devices are shown in block diagram form in order to facilitate description of the present invention. It is also to be understood that like reference numerals throughout the description imply similar functionality, however the use of like reference numerals does not necessarily imply the same device.

FIG. 1 illustrates a perspective view of an exemplary conventional semiconductor device 10 comprising a graded junction 12 in a semiconductor substrate 14. Graded junctions typically comprise doped regions having varying junction depths in-order to meet different electrical resistance requirements and current handling requirements of the semiconductor device 10 (e.g., a buried bitline). The graded junction 12 comprises a first doped region 16 and a second doped region 18, wherein each of the first doped region and the second doped region have a specified conductivity to meet the requirements of the semiconductor device 10. For example, such a graded junction can be utilized in a buried bitline or a lightly-doped-drain (LDD) transistor. Further processes are also typically performed in the manufacture the semiconductor device 10, such as in the case of a buried bitline, wherein a dielectric 20 is formed over the semiconductor substrate 14, and a bitline oxide 22 is formed over the first doped region 16 and second doped region 18 of the substrate.

Figure 2:
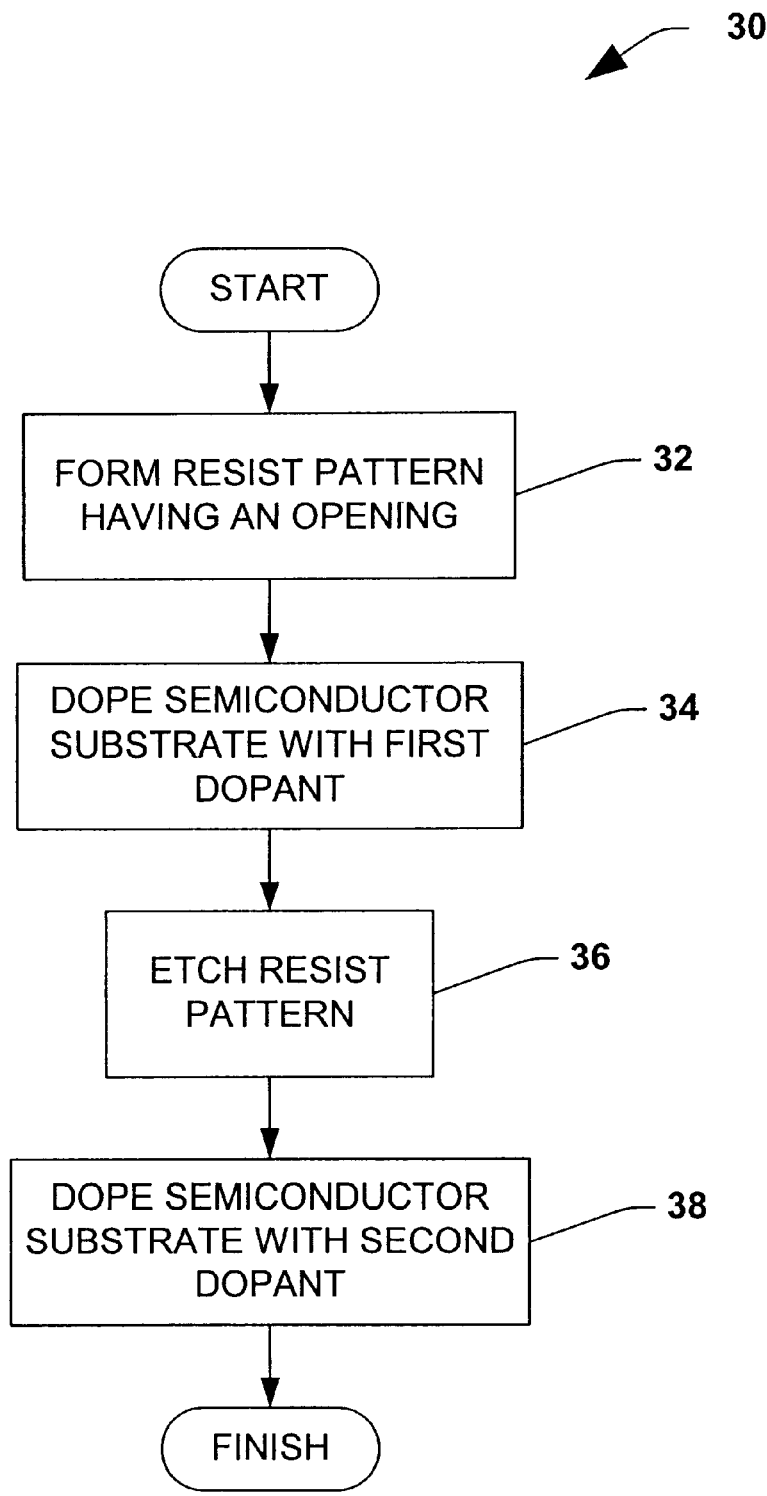
FIG. 2 illustrates a flow chart diagram representation of a conventional methodology of forming a graded junction.
Figure 3A:
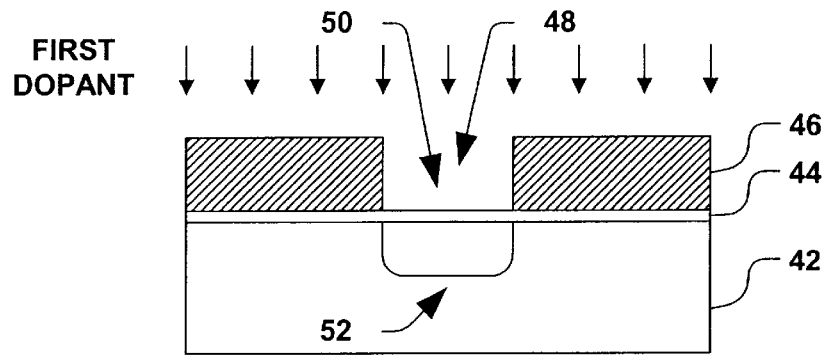
FIGS. 3a–3c illustrate side cross-sectional views of conventional processing steps for forming a graded junction.
Figure 3B:
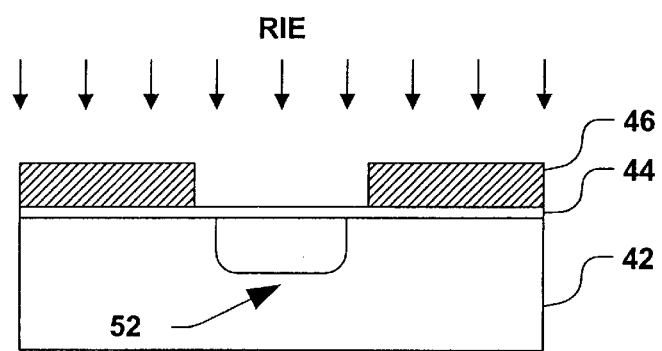
Figure 3C:
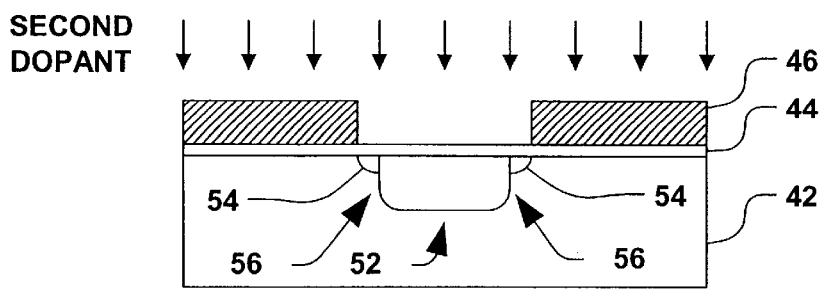

A conventional method for forming a graded junction is illustrated in FIG. 2 and FIGS. 3A–3C, respectively. Method 30 begins at step 32, wherein a masking pattern is formed over a silicon substrate. Referring now to FIG. 3A, an exemplary portion 40 of a silicon substrate 42 is illustrated, wherein a dielectric layer 44 and a resist 46 have been formed over the substrate. An opening 48 in the resist 46 generally exposes a predetermined portion of the dielectric layer 44 overlying the substrate 42. As illustrated in FIG. 2, step 34 comprises doping the substrate 42 with a first dopant, thereby forming a buried bitline region 52, as illustrated in FIG. 3A. The method 30 of FIG. 2 continues with etching the resist at step 36, thereby increasing a lateral dimension of the opening 48, as illustrated in FIG. 3B. After etching the resist 46, a second dopant is utilized at step 38 of FIG. 2 to dope the substrate 42 with a second dopant, wherein pocket regions 54 are formed, thereby defining a graded junction 56.

Such a method 30 has several difficulties. For example, altering the resist opening (step 36) in a controlled, reliable manner is difficult, and may result in non-uniformities. In addition, a minimum geometry associated with at least one region 52 of the graded junction 56 is dictated by the capability of a lithography system which exposes the substrate 14. Therefore, one heretofore has not been capable of making implanted regions 52 using substantially normal incidence of exposure, wherein the geometry of the region 52 was smaller than the capability of the lithography system.

Figure 4:
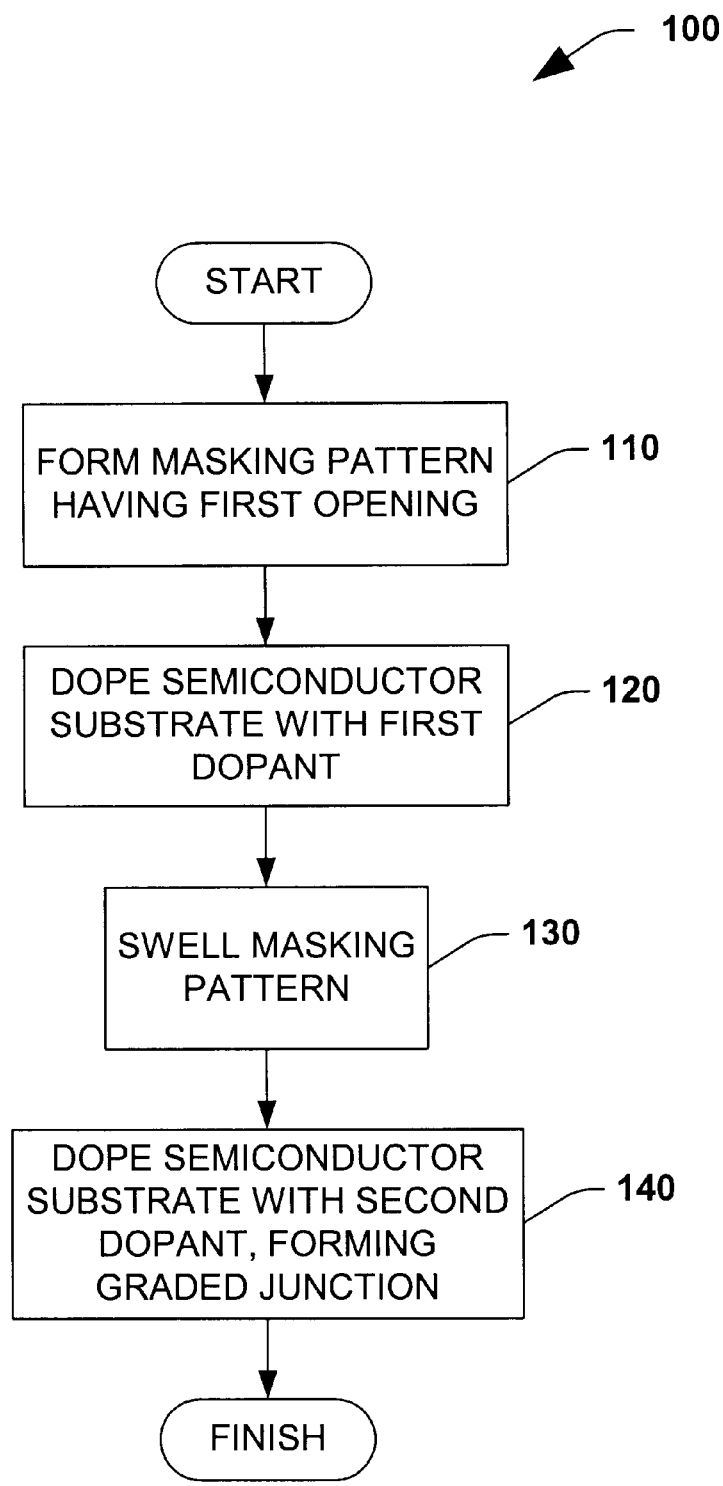
FIG. 4 illustrates a flow chart diagram representation of a method in accordance with one aspect of the present invention.

FIG. 4 illustrates an exemplary method 100 of forming a graded junction according to the present invention. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

Figure 5:
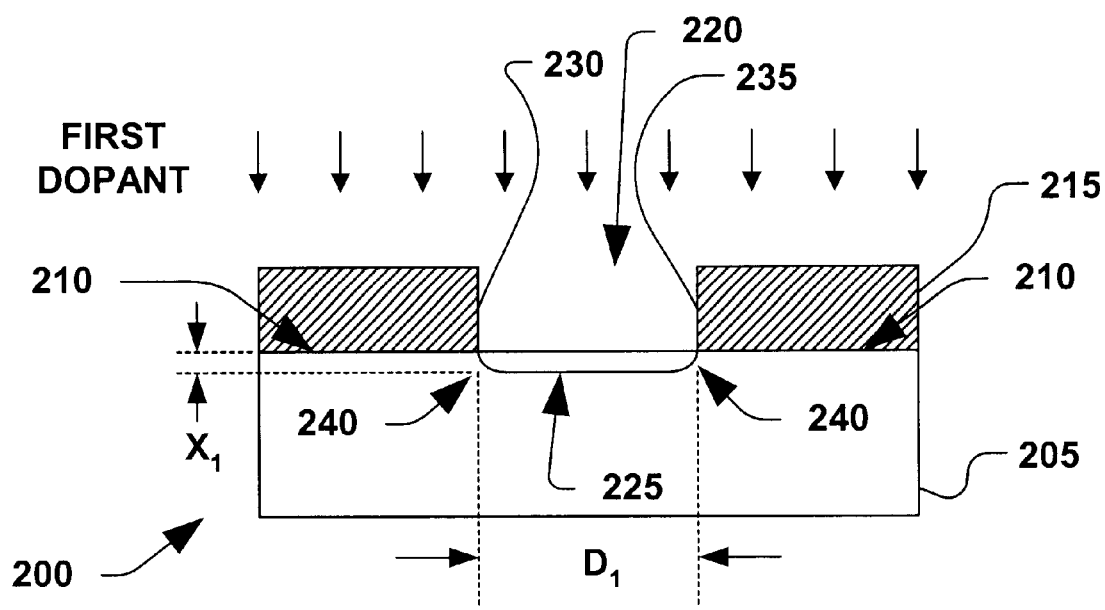
FIGS. 5–10 illustrate side cross-sectional views of processing steps to form a graded junction in accordance with one aspect of the present invention.

The method 100 begins with forming a first masking pattern over a semiconductor substrate at 110, wherein the first masking pattern comprises a first opening. An exemplary result of performing act 10 is illustrated in FIG. 5. FIG. 5 illustrates, in cross-section, a portion 200 of an exemplary semiconductor substrate 205 having a surface 210. A first masking pattern 215 is formed over the surface 210 of the substrate 205 at 110, wherein the first masking pattern has a first opening 220 associated therewith. As will be understood by one of ordinary skill in the art, the first masking pattern 215 is formed, for example, by depositing a layer of photoresist over the surface 210 of the substrate 205. The photoresist is then exposed to a predetermined wavelength of radiation through a masking reticle (not shown), and developed in a conventional developing solution to form the first opening 220. The first opening 220 is further characterized by a first lateral dimension $D_1$, wherein the first lateral dimension is measured between a first sidewall 230 and a second sidewall 235 of the first opening.

Referring again to FIG. 4, a first doping process is performed on the semiconductor substrate 205 at 120, wherein the first masking layer 215 of FIG. 5 is used as a doping mask. The first doping process of act 120 is carried out to form, as illustrated in FIG. 5, a first dopant region 225 in the semiconductor substrate 205 associated with the first opening 220. The first dopant region 225 generally has a first junction profile 240 that is substantially continuous with the first sidewall 230 and second sidewall 235, respectively. The first dopant region 225 is furthermore characterized by the first lateral dimension $D_1$, as well as by a first junction depth $X_1$.

In accordance with one aspect of the present invention, the first dopant region 225 is formed by ion implantation of a first conductivity type. Alternatively, other exemplary doping processes can be carried out to form the first dopant region 225, such as molecular beam ion implantation or plasma induced ion deposition. According to one exemplary aspect of the invention, a p-type dopant, such as boron, is utilized in doping the semiconductor substrate 205 to form the first dopant region 225.

After forming the first dopant region 225, further processing is carried out at 130 of FIG. 4 to swell the first masking pattern 215. For example, a RELACS process is performed, wherein the first masking pattern 215 swells by a predetermined amount. According to one exemplary aspect of the present invention, the first masking pattern 215 comprises a photoresist, and the photoresist is swelled by wetting the photoresist with a solvent, or by treating the resist with an organic chemical, such as a saturated hydrocarbon (e.g., an aliphatic or aromatic hydrocarbon). Alternatively, the first masking pattern 215 comprises a hydrophilic resin with swelling properties. Those skilled in the art will appreciate that various methods (e.g., a thermal flow process) for swelling the first masking pattern 215 exist, depending upon the particular material composition of the first masking pattern, and all such swelling methods are contemplated as falling within the scope of the present invention.

Figure 6:
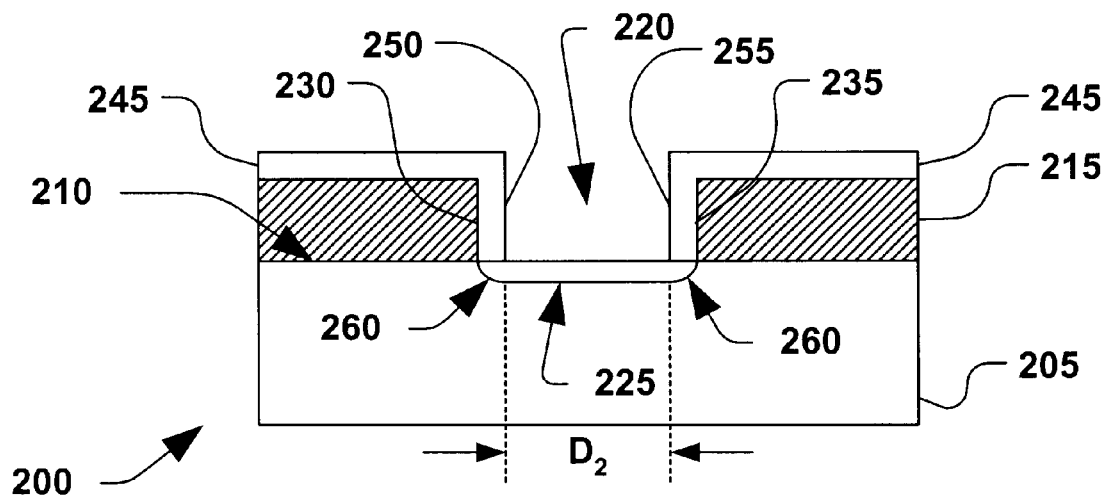

FIG. 6 illustrates the result of act 130, wherein a swelled portion 245 of the first masking pattern 215 decreases the magnitude of first lateral dimension $D_1$ of the first opening 220 to a second lateral dimension $D_2$. Accordingly, after swelling the first masking pattern 215, the swelled portion 245 overlies one or more portions 260 of the first dopant region 225. According to another aspect of the present invention, substantially vertical edge surfaces 250 and 255 are formed by swelling the first sidewall 230 and second sidewall 235, respectively, of the first masking pattern 215 at act 130. During the swelling process of the present invention, all surfaces of the first masking pattern 215 are furthermore swelled at approximately the same rate, however, a selective swelling of one or more sidewalls is contemplated as falling within the scope of the present invention.

Figure 7:
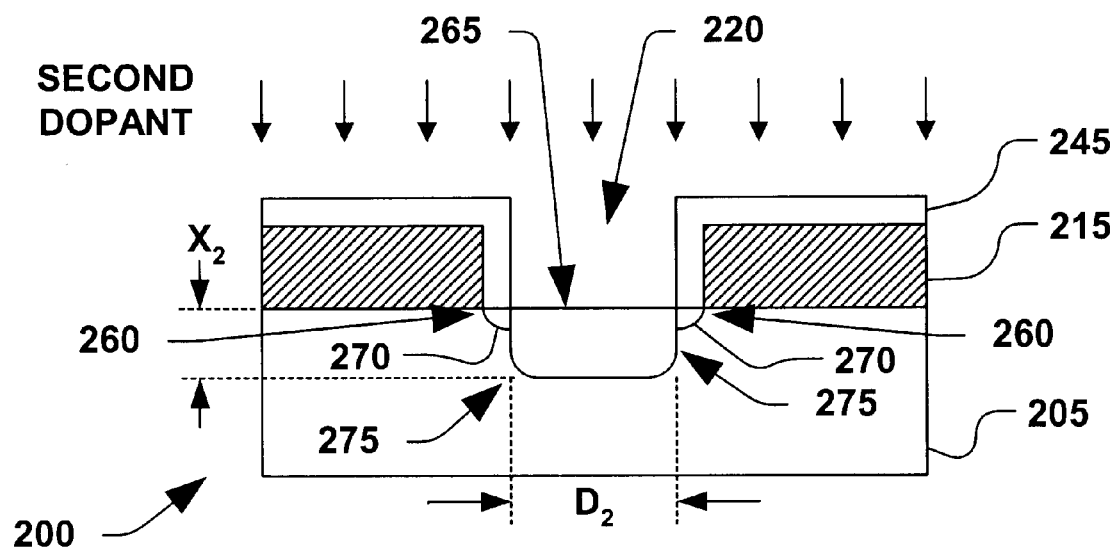

Referring again to FIG. 4, a second doping process is performed on the semiconductor substrate 205 at 140, wherein the first masking pattern 215 is again used as a doping mask after the swelling thereof. The second doping process is carried out to form, as illustrated in FIG. 7, a second dopant region 265 associated with the first, reduced opening 220. The second dopant region 265 generally has a second junction profile 275 that is substantially continuous with the respective edge surfaces 250 and 255 of the swelled portion 245 of the first masking pattern 215. The second dopant region 265 is furthermore characterized by the second lateral dimension $D_2$, as well as by a second junction depth $X_2$. In accordance with one exemplary aspect of the invention, the second junction depth $X_2$ of the second dopant region 265 is greater than the first junction depth $X_1$ of the first dopant region 225.

In accordance with another aspect of the present invention, the second dopant region 265 is formed by ion implantation of a second conductivity type. Alternatively, other exemplary doping processes can be carried out to form the second dopant region 265, such as molecular beam ion implantation or plasma induced ion deposition. According to one exemplary aspect of the invention, an n-type dopant, such as arsenic, phosphorus, or antimony, is utilized in doping the semiconductor substrate 205 to form the second dopant region 265.

After the second doping process is performed, the one or more portions 260 of the first dopant region 225 generally maintain the first dopant conductivity, thereby defining pocket regions 270 within the semiconductor substrate 205. One particular advantage of the present invention includes the ability to define the pocket regions 270 by implanting ions at a normal angle of incidence with respect to the surface 210 of the semiconductor substrate 205. By carrying out the ion implantation step at a normal angle of incidence, the first junction profile 240 of FIG. 5 can be precisely formed in the semiconductor substrate 205 relative to second junction profile 275 of second dopant region 265, as illustrated in FIG. 7. Additionally, the junction depth $X_1$ of the pocket regions 270 can be precisely controlled. Those skilled in the art will recognize that a particular advantage exists in the present invention as compared to large angles of incidence used by prior art methods for the formation of pocket implant regions.

Those skilled in the art will also recognize that the first junction profile 240 of FIG. 5, in combination with the second junction profile 275 of FIG. 7, can be characterized as a graded junction within the semiconductor substrate 205. It is also apparent from the foregoing description that additional processing of the first masking pattern 215 can be carried out to further decrease the lateral dimension of the first opening 220, followed by the formation of additional doped regions within semiconductor substrate 205. Depending upon the particular junction depth of the additional doped regions, various graded junction profiles can be formed by the method of the present invention. In addition, the swelling process and subsequent doping actions can be repeated multiple times to form various other types of junctions. Furthermore, the first doped region 225 and the second doped region 265 may have differing conductivity types, as in the case of an exemplary buried bitline, or the first doped region and the second doped region may have substantially the same conductivity type with varying dopant concentrations, as in the case of an exemplary LDD transistor. Accordingly, all such variations in graded junction profiles fall within the scope of the present invention. Also, it should be noted that in FIGS. 5–7, no oxide is illustrated overlying the substrate and underlying the patterned resist, however, it should be understood that such an oxide or ONO layer may exist thereat and the implantation discussed herein can be performed through such layer; such implementations are contemplated as falling within the scope of the present invention.

Figure 8:
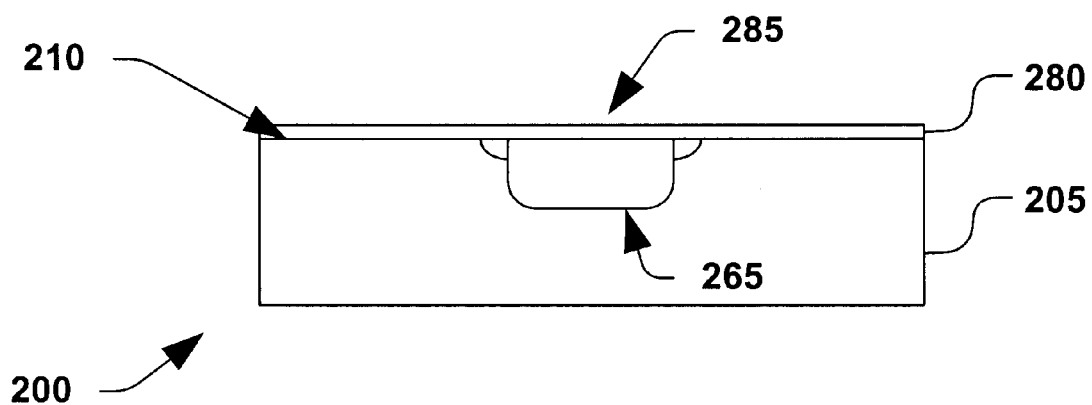

According to yet another exemplary aspect of the present invention, as illustrated in FIG. 8, a dielectric layer 280 is formed over the surface 210 of the semiconductor substrate 205. One exemplary benefit to forming the dielectric layer 280 is to generally provide resistance to thermal oxidation of the semiconductor substrate 205. The dielectric layer 280, for example, comprises a composite dielectric layer, such as silicon dioxide and silicon nitride. The dielectric layer can furthermore comprise an oxide-nitride (ON) layer, or an oxide-nitride-oxide (ONO) layer. The dielectric layer 280 is formed, for example, prior to forming the first masking layer 215.

Figure 9:
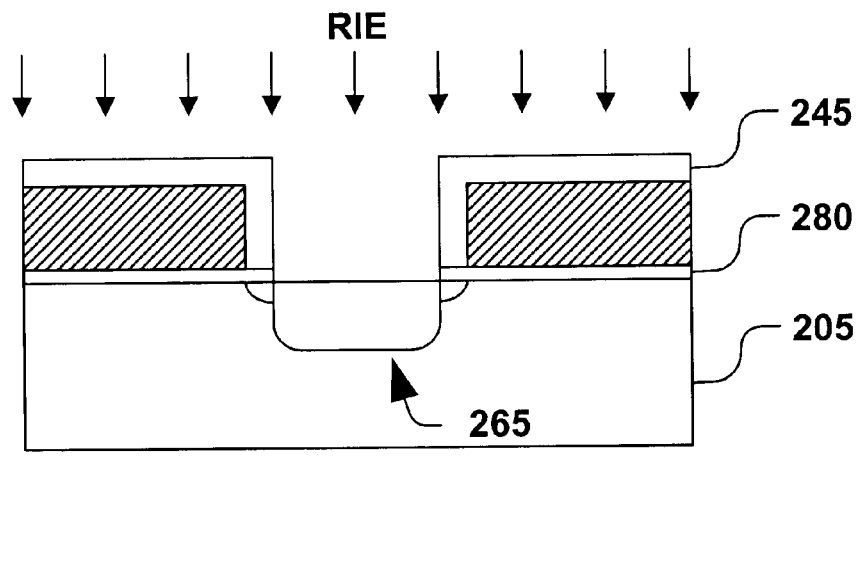

In accordance with still another aspect of the present invention, one or more portions 285 of the dielectric layer 280 which overlie the second dopant region 265 are removed, thereby exposing the semiconductor substrate 205, as illustrated in FIG. 9. For example, the dielectric layer 280 is anisotropically etched using the first masking pattern 215 as an etching mask. The anisotropically etching process selectively removes the material of dielectric layer 280 while not substantially etching the surface 210 of the semiconductor substrate 205. Those skilled in the art will recognize that, depending upon the particular material forming dielectric layer 280, various etching methods can be used to anisotropically etch the dielectric layer. For example, wherein the dielectric layer 280 comprises a layer of silicon nitride, fluorine based etching chemistry can be used in a reactive-ion-etching (RIE) etching apparatus. Accordingly, wherein the dielectric layer 280 is a composite material, such as ONO, sequential silicon oxide and silicon nitride etching processes can be used to anisotropically etch the dielectric layer. In accordance with an alternative aspect of the present invention, the dielectric layer 280 overlying the second dopant region 265 is not removed and the implantation occurs through the dielectric layer 280. In such case the discussion below in conjunction with FIG. 10 is not performed.

Figure 10:
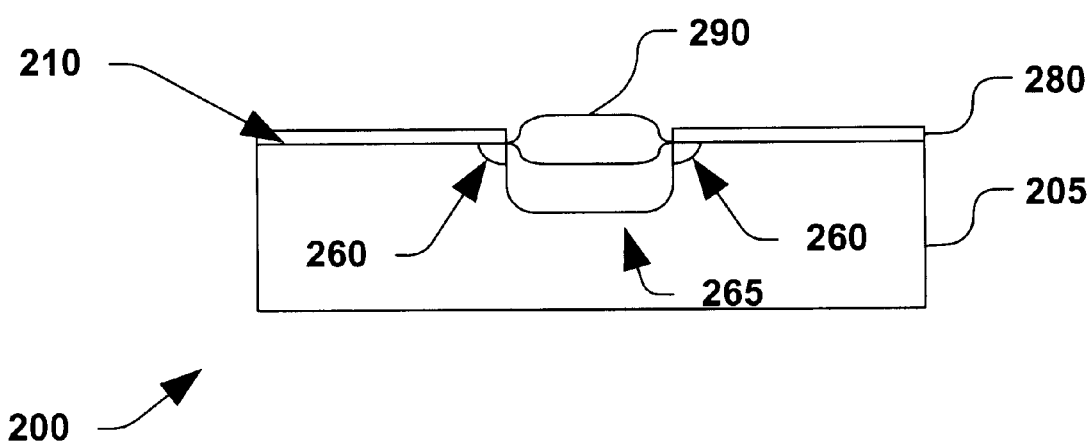

Referring now to FIG. 10, another exemplary aspect of the invention illustrates removing the first masking pattern 215 after etching the dielectric layer 280, and performing an oxidation process to form a bit-line oxide region 290. The bit-line oxide region 290 generally overlies the second dopant region 265 (e.g., a buried bitline region). The bit-line oxide region 290 is formed, for example, by thermally oxidizing the semiconductor substrate 205 using the dielectric layer 280 as an oxidation mask. Because the dielectric layer 280 is generally resistant to thermal oxidation, the portions of the surface 210 of the semiconductor substrate 205 underlying the dielectric layer 280 are not oxidized.

According to another aspect of the present invention, further processing steps can be carried out, including the formation of a control gate, electrical contacts, and other components as will be understood by one of ordinary skill in the art, to form a complete EEPROM memory cell. Those skilled in the art will appreciate that various structures can be formed by the method of the present invention. For example, LDD regions can be formed in a MOS transistor following substantially the same procedures described above. Additionally, other substrate structures, such as buried resistors, and the like, can also be formed by the method of the present invention.

The example of FIGS. 5–10 illustrate employing the method 100 of FIG. 4 to form a graded junction in a buried bit line structure, wherein regions 260 form pocket type implants, and region 265 comprises the buried bit line. The method 100 of FIG. 4 may also be employed to form LDD type graded junctions, wherein a region 260 may comprise a lightly doped source/drain region, and region 265 comprises a source/drain region. In such an example, multiple resist mask openings could be formed if a symmetric LDD device was desired, and successive doping of the same dopant conductivity type (but different doses) would be employed in conjunction with the resist swelling to form graded LDD regions in the substrate. Subsequently, the resist mask could be removed, and gate oxide and polysilicon layers could be formed or deposited and patterned to form an LDD transistor over the graded LDD regions in the substrate.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A method of forming a graded junction for a device on a semiconductor substrate, the method comprising the steps of:

forming a dielectric layer overlying a surface of the semiconductor substrate;

forming a first masking pattern overlying the dielectric layer overlying the surface of the semiconductor substrate, the first masking pattern having a first opening associated with a first region of the semiconductor substrate, wherein the first opening has a first lateral dimension:

doping the semiconductor substrate with a first dopant of a first conductivity type, wherein the first masking pattern is used as a doping mask to form a first dopant region in the semiconductor substrate;

swelling the first masking pattern to decrease the first lateral dimension of the first opening to a second lateral dimension, wherein the second lateral dimension is smaller than the first lateral dimension, and wherein the swelled doping mask overlies one or more portions of the first dopant region; and doping the semiconductor substrate with a second dopant of a second conductivity type, wherein the swelled first masking pattern is used as a doping mask to form a second dopant region in the semiconductor substrate, wherein the second dopant region defines a buried bitline region, the method further comprising the steps of:

selectively etching the dielectric layer overlying the first dopant region prior to swelling the first masking pattern;

removing the first masking pattern after doping the semiconductor substrate with the second dopant; and oxidizing the semiconductor substrate to form a bitline oxide region overlying the first region.

2. The method of claim 1, wherein the step of forming a dielectric layer comprises forming an oxide-nitride-oxide (ONO) layer.

3. The method of claim 1, wherein the step of forming a dielectric layer comprises forming an oxide-nitride (ON) layer.

4. The method of claim 1, wherein the step of doping the semiconductor substrate to form a first dopant region comprises performing a boron ion implantation.

5. The method of claim 1, wherein the step of doping the semiconductor substrate to form the second dopant region comprises performing an arsenic, phosphorus, or antimony ion implantation.

6. The method of claim 1, further comprising the step of removing the first masking pattern after doping the semiconductor substrate with the first dopant and the second dopant.

7. The method of claim 1, wherein the step of swelling the first masking layer comprises performing a thermal flow process.

8. The method of claim 1, wherein the one or more portions of the first dopant region masked by the swelled doping mask generally maintain the first conductivity type, thereby defining pocket regions in the semiconductor substrate adjacent to the second dopant region.

9. The method of claim 1, wherein the first and second conductivity types are different.

10. The method of claim 1, wherein the step of forming a first masking pattern comprises forming a photoresist pattern.

11. The method of claim 10, wherein the step of swelling the first masking pattern to decrease the first lateral dimension of the first opening to a second lateral dimension comprises wetting the photoresist with a solvent.

12. The method of claim 10, wherein the step of swelling the first masking pattern to decrease the first lateral dimension of the first opening to a second lateral dimension comprises treating the photoresist with an organic material.

13. The method of claim 10, wherein the step of swelling the first masking pattern to decrease the first lateral dimension of the first opening to a second lateral dimension comprises using a hydrophilic resin with swelling properties.

14. A method of forming a graded unction for a device on a semiconductor substrate, the method comprising the steps of:

forming a first masking pattern overlying a surface of the semiconductor substrate, the first masking pattern having a first opening associated with a first region of the semiconductor substrate, wherein the first opening has a first lateral dimension;

doing the semiconductor substrate with a first dopant of a first conductivity type, wherein the first masking pattern is used as a doping mask to form a first dopant region in the semiconductor substrate;

swelling the first masking pattern to decrease the first lateral dimension of the first opening to a second lateral dimension, wherein the second lateral dimension is smaller than the first lateral dimension, and wherein the swelled doping mask overlies one or more portions of the first dopant region;

doping the semiconductor substrate with a second dopant of a second conductivity type, wherein the swelled first masking pattern is used as a doping mask to form a second dopant region in the semiconductor substrate; and removing the first masking pattern after doping the semiconductor substrate with the first dopant and the second dopant;

forming a dielectric layer overlying the surface of the semiconductor substrate;

forming polysilicon layer overlying the dielectric layer;

forming a second masking pattern overlying the first region of the semiconductor substrate;

etching the polysilicon layer and the dielectric layer using the second masking pattern and the semiconductor substrate as an etch stop, thereby forming a gate of a lightly-doped-drain (LDD) transistor; and removing the second masking pattern.

15. The method of claim 14, wherein the step of forming a dielectric layer comprises forming an oxide-nitride-oxide (ONO) layer.

16. The method of claim 14, wherein the step of forming a dielectric layer comprises forming a field oxide layer.

\* \* \* \* \*

UNITED STATES PATENT AND TRADEMARK OFFICE
CERTIFICATE OF CORRECTION

PATENT NO. : 6,642,148 B1
DATED : November 4, 2003
INVENTOR(S) : Kouros Ghandehari et al.

It is certified that error appears in the above-identified patent and that said Letters Patent is hereby corrected as shown below:

<u>Column 4,</u>
Line 37, please replace the numeral "10" with the numeral -- 110 --.

Signed and Sealed this

Sixteenth Day of December, 2003

JAMES E. ROGAN
*Director of the United States Patent and Trademark Office*